United States Patent
Takeishi (10) Patent No.: US 10,350,624 B2
(45) Date of Patent: Jul. 16, 2019

(54) COATING APPARATUS AND COATING METHOD

(71) Applicant: Toshiba Memory Corporation, Minato-ku (JP)

(72) Inventor: Tomoyuki Takeishi, Yokkaichi (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 358 days.

(21) Appl. No.: 15/054,343

(22) Filed: Feb. 26, 2016

(65) Prior Publication Data
US 2017/0151581 A1    Jun. 1, 2017

(30) Foreign Application Priority Data
Dec. 1, 2015   (JP) ................. 2015-234466

(51) Int. Cl.
| | |
|---|---|
| B05D 3/12 | (2006.01) |
| B05B 12/16 | (2018.01) |
| B05D 1/00 | (2006.01) |
| B05D 1/02 | (2006.01) |
| H01L 21/67 | (2006.01) |
| G03F 7/16 | (2006.01) |

(52) U.S. Cl.
CPC .............. *B05B 12/16* (2018.02); *B05D 1/005* (2013.01); *B05D 1/02* (2013.01); *G03F 7/162* (2013.01); *H01L 21/6715* (2013.01)

(58) Field of Classification Search
CPC ....... B05D 1/005; B05D 1/02; H01L 21/6715; G03F 7/162; B05B 12/16
USPC ........................................................... 427/240
See application file for complete search history.

(56) References Cited

U.S. PATENT DOCUMENTS

| | | | | |
|---|---|---|---|---|
| 5,939,139 A | * | 8/1999 | Fujimoto | ............ B05C 11/08 |
| | | | | 118/52 |
| 6,191,053 B1 | * | 2/2001 | Chun | ................ B05C 11/08 |
| | | | | 438/780 |
| 6,635,113 B2 | * | 10/2003 | Takamori | ........... H01L 21/6715 |
| | | | | 118/52 |
| 6,777,350 B2 | * | 8/2004 | Nakagawa | ............ B05D 1/005 |
| | | | | 118/320 |
| 7,371,434 B2 | * | 5/2008 | Ito | ......................... G03F 7/162 |
| | | | | 118/321 |
| 8,166,913 B2 | | 5/2012 | Tanaka | |
| 2002/0037367 A1 | * | 3/2002 | Ema | ..................... B05D 3/0254 |
| | | | | 427/240 |

(Continued)

FOREIGN PATENT DOCUMENTS

| | | |
|---|---|---|
| JP | 58-82521 | 5/1983 |
| JP | 2003-289038 | 10/2003 |
| JP | 2008-60462 | 3/2008 |

*Primary Examiner* — Kirsten Jolley
(74) *Attorney, Agent, or Firm* — Oblon, McClelland, Maier & Neustadt, L.L.P.

(57) ABSTRACT

According to one embodiment, provided is a coating apparatus. The coating apparatus includes a first discharger, a second discharger, and a third discharger. The first discharger discharges a first liquid on a top surface of a substrate. In addition, the second discharger discharges a second liquid of which surface tension is higher than surface tension of the first liquid on the top surface of the substrate. In addition, the third discharger is disposed in a side outer than the first discharger in the substrate and discharges a gas on the top surface of the substrate.

7 Claims, 6 Drawing Sheets

(56) References Cited

U.S. PATENT DOCUMENTS

| | | | |
|---|---|---|---|
| 2009/0227120 A1* | 9/2009 | Liu | G03F 7/162 438/782 |
| 2012/0021609 A1* | 1/2012 | Parbhoo | B05D 1/002 438/763 |
| 2013/0089668 A1* | 4/2013 | Inagaki | H01L 21/6715 427/261 |
| 2016/0062240 A1* | 3/2016 | Muta | G03F 7/3021 430/434 |

* cited by examiner

COATING APPARATUS AND COATING METHOD

CROSS-REFERENCE TO RELATED APPLICATIONS

This application is based upon and claims the benefit of priority from Japanese Patent Application No. 2015-234466, filed on Dec. 1, 2015; the entire contents of which are incorporated herein by reference.

FIELD

Embodiments of the present invention relate generally to a coating apparatus and a coating method.

BACKGROUND

In a process of manufacturing a semiconductor device, a substrate of a wafer or the like is coated with a chemical solution such as resist, so that a film is formed on the wafer. In such a resist coating process, as a method of uniformly coating a surface of the wafer with the resist, a spin coating method is used. The spin coating method is a coating method of dropping the resist on the wafer while rotating the wafer.

In such a spin coating method, in order to efficiently coat the wafer with a low consumed amount of the resist ejected from a nozzle, before the resist coating, a solvent is dropped from a center of the wafer. Therefore, a pre-wetting process of wetting the surface of the wafer in advance is performed.

However, in a case where the pre-wetting process is performed from the center position of the wafer, the content of the solvent occupied in the resist is different in a radial direction of the wafer. As a result, after an exposing process of forming a latent image of a pattern on the wafer and a developing process of forming a resist pattern are performed, dimensions and shape of the resist pattern is different in the radial direction of the wafer.

DETAILED DESCRIPTION

According to an embodiment, there is provided a coating apparatus. The coating apparatus includes a first discharger, a second discharger, and a third discharger. The first discharger discharges a first liquid on a top surface of a substrate. In addition, the second discharger discharges a second liquid of which surface tension is higher than that of the first liquid on the top surface of the substrate. In addition, the third discharger is disposed in a side outer than the first discharger in the substrate and discharges a gas on the top surface of the substrate.

Exemplary embodiments of a coating apparatus and a coating method will be explained below in detail with reference to the accompanying drawings. The present invention is not limited to the following embodiments.

Embodiment

Figure 1:
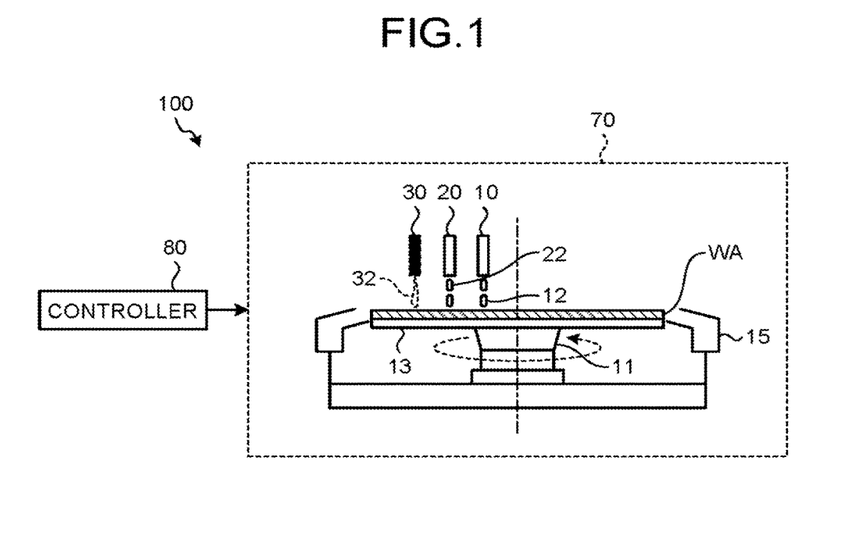
FIG. 1 is a cross-sectional diagram schematically illustrating a configuration of a coating apparatus according to an embodiment.

FIG. 1 is a cross-sectional diagram schematically illustrating a configuration of a coating apparatus according to an embodiment. The coating apparatus 100 is an apparatus that forms a coating film on a substrate (semiconductor substrate) according to a spin coating method. The coating apparatus 100 includes a coating unit 70 and a controller 80.

The coating unit 70 includes a first nozzle (first discharger) that ejects (discharges) a first coating liquid (first liquid), a second nozzle (second discharger) that ejects a second coating liquid (second liquid), and a third nozzle (third discharger) that ejects a gas. The second coating liquid is a liquid of which surface tension is higher than that of the first coating liquid.

In the present embodiment, a case where the first coating liquid is resist and the first nozzle is a resist nozzle 10 will be described. In addition, a case where the second coating liquid is thinner and the second nozzle is a thinner nozzle 20 will be described. In addition, a case where the gas is an inert gas such as $N_2$ gas (nitrogen gas) and the third nozzle is an $N_2$ nozzle 30 will be described. In addition, a case where the substrate where a resist film as a coating film is formed is a wafer WA will be described.

The coating apparatus 100 includes a resist nozzle 10 that discharges resist 12, a thinner nozzle 20 that discharges thinner 22, and an $N_2$ nozzle 30 that discharges $N_2$ gas 32. In addition, the coating apparatus 100 includes a support base 13, a spin motor 11, and a cup 15.

The support base 13 has a top surface shape that is a substantially disk shape. A wafer WA is placed on the top surface of the support base 13. The support base 13 has a spin chuck (not illustrated). The spin chuck fixes and holds the wafer WA by vacuum suction.

The spin motor 11 is attached below the support base 13. The spin motor 11 rotates the support base 13 at a predetermined rotation speed to rotate the wafer WA. The spin motor 11 rotates the wafer WA to spread the resist 12 or the thinner 22 dropped on the wafer WA in the radial direction (toward the outer circumferential side) of the wafer WA by a centrifugal force. The spin motor 11 rotates the wafer WA at a predetermined speed to expel the resist 12 or the thinner 22 remaining on the wafer WA by the centrifugal force.

The cup 15 is disposed in the outer circumferential side of the support base 13. The cup 15 is configured in a ring shape so as to receive the resist 12 or the thinner 22 expelled from the wafer WA. The cup 15 collects the resist 12 or the thinner 22 expelled from the wafer WA.

The resist nozzle 10 discharges the resist 12 at the center position of the wafer WA. Therefore, the resist nozzle 10 drops droplets of the resist 12 to the center position of the wafer WA. The resist nozzle 10 discharges the resist 12, for example, in the vertical direction.

The resist nozzle 10 is moved by a resist nozzle scanning arm (not illustrated). The resist nozzle 10 is attached to a distal end of the resist nozzle scanning arm through a nozzle arm. The scanning arm is installed to be movable between the center position and the outer circumference position of the wafer WA. The resist nozzle 10 is connected to a resist supply pipe (not illustrated), and the resist supply pipe is connected to a resist tank (not illustrated). Therefore, the resist nozzle 10 can supply the resist 12 while moving in the radial direction of the wafer WA.

The thinner nozzle 20 is moved on the wafer WA from the outer circumference position toward the center position. The thinner nozzle 20 discharges the thinner 22 on the wafer WA while moving, so that the thinner nozzle 20 drops the droplets of the thinner 22 on the wafer WA. The thinner 22 is a liquid of which surface tension is higher than that of the resist 12. The thinner nozzle 20 discharges the thinner 22, for example, in the vertical direction.

The thinner nozzle 20 is moved by a thinner nozzle scanning arm (not illustrated). The thinner nozzle 20 is attached to a distal end of the thinner nozzle scanning arm through a nozzle arm. The scanning arm is installed to be movable between the center position and the outer circumference position of the wafer WA. The thinner nozzle 20 is connected to a thinner supply pipe (not illustrated), and the thinner supply pipe is connected to a thinner tank (not illustrated). Therefore, the thinner nozzle 20 can supply the thinner 22 while moving in the radial direction of the wafer WA.

The $N_2$ nozzle 30 is moved on the wafer WA from the outer circumference direction toward the center position. The $N_2$ nozzle 30 discharges $N_2$ gas 32 on the wafer WA while moving, so that the $N_2$ nozzle 30 sprays the $N_2$ gas 32 on the wafer WA. The $N_2$ nozzle 30 discharges the $N_2$ gas, for example, in the vertical direction.

The $N_2$ nozzle 30 is moved by an $N_2$ nozzle scanning arm (not illustrated). The $N_2$ nozzle 30 is attached to a distal end of the $N_2$ nozzle scanning arm through a nozzle arm. The scanning arm is installed to be movable between the center position and the outer circumference position of the wafer WA. The $N_2$ nozzle 30 is connected to an $N_2$ supply pipe (not illustrated), and the $N_2$ supply pipe is connected to an $N_2$ tank (not illustrated). Therefore, the $N_2$ nozzle 30 can supply the $N_2$ gas 32 while moving in the radial direction of the wafer WA.

The controller 80 includes a at least one processor. The controller 80 controls the coating unit 70. The controller 80 controls the positions (moving speeds) of the resist nozzle 10, the thinner nozzle 20, and the $N_2$ nozzle 30 on the wafer WA. In addition, the controller 80 controls a discharging amount of the resist 12 from the resist nozzle 10, a discharging amount of the thinner 22 from the thinner nozzle 20, and a discharging amount of the $N_2$ gas 32 from the $N_2$ nozzle 30.

The controller 80 controls a dropping amount of the thinner 22 or a moving speed of the thinner nozzle 20 for every position (dropping position) on the wafer WA. In addition, the controller 80 controls the movement of the $N_2$ nozzle 30 so that the moving speed of the $N_2$ nozzle 30 is equal to the moving speed of the thinner nozzle 20.

The coating apparatus 100 according to the present embodiment simultaneously performs discharging the thinner 22 by the thinner nozzle 20 and discharging the $N_2$ gas 32 by the $N_2$ nozzle 30. In addition, the thinner nozzle 20 and the $N_2$ nozzle 30 discharge the thinner 22 and the $N_2$ gas 32 while moving from the outer side to the inner side of the wafer WA. In addition, the $N_2$ nozzle 30 is disposed in the side outer than the thinner nozzle 20 (outer circumferential portion side) as viewed from the center of the support base 13. In other words, with respect to the rotation axis of the support base 13, the $N_2$ nozzle 30 is disposed in the side outer than the thinner nozzle 20. For example, in the movement direction where the $N_2$ nozzle 30 and the thinner nozzle 20 move straightly toward the center of the wafer WA, the $N_2$ nozzle 30 is disposed in the side of the wafer WA outer than the thinner nozzle 20.

In the present embodiment, the controller 80 controls a dropping amount of the thinner 22 dropped on the wafer WA per unit area for every radial position of the wafer WA (support base 13). For example, the controller 80 allows the thinner 22 to be dropped on the wafer WA at a flowrate according to the radial position of the wafer WA. In addition, the controller 80 may move the thinner nozzle 20 at a speed according to the radial position of the wafer WA.

The coating apparatus 100 discharges the thinner 22 on the wafer WA by the thinner nozzle 20 and discharges the $N_2$ gas 32 on the wafer WA by the $N_2$ nozzle 30. At this time, the $N_2$ gas 32 may be sprayed in the side of the wafer WA outer than the thinner 22. The thinner nozzle 20 and the $N_2$ nozzle 30 are moved from the outer circumference position toward the center position of the wafer WA. Therefore, the thinner 22 and the $N_2$ gas 32 are discharged in order from the outer circumferential side of the wafer WA toward the central axis side of the wafer WA. In the coating apparatus 100, if the thinner 22 is dropped to the center position of the wafer WA, the resist 12 is discharged on the wafer WA by the resist nozzle 10.

Figure 2A:
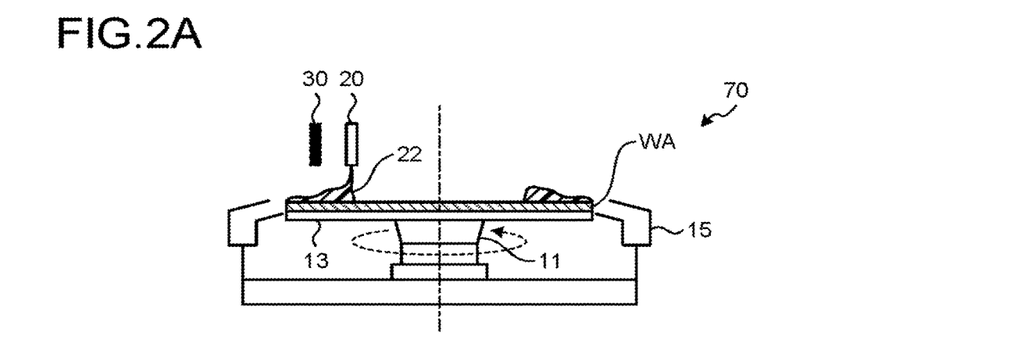
FIGS. 2A to 2D are diagrams for describing a procedure of a coating process according to the embodiment.

FIGS. 2A to 2D are diagrams for describing a procedure of a coating process according to the embodiment. As illustrated in FIG. 2A, the coating apparatus 100 rotates the spin motor 11 to rotate the wafer WA on the support base 13 in a wafer surface. At this time, the thinner 22 is dropped on the wafer WA by the thinner nozzle 20. In addition, the $N_2$ gas is sprayed on the wafer WA by the $N_2$ nozzle 30. The thinner 22 and the $N_2$ gas are simultaneously supplied to the wafer WA. In this case, the position on the wafer WA where the $N_2$ gas is sprayed is closer to the outer circumferential portion of the wafer WA than the position on the wafer WA where the thinner 22 is dropped.

Figure 2B:
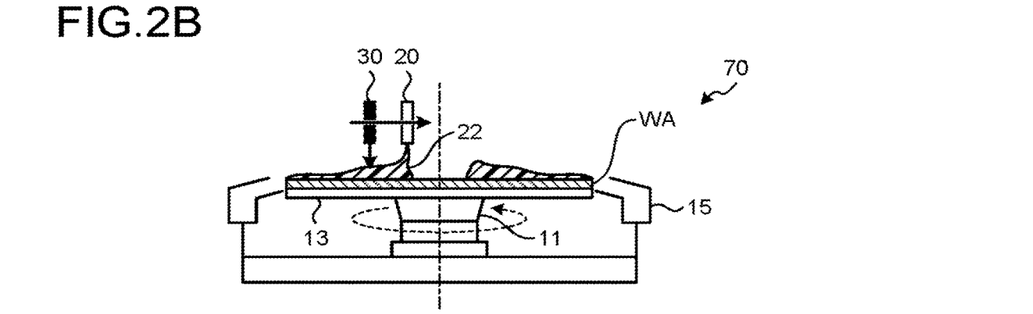

As illustrated in FIG. 2B, the thinner nozzle 20 and the $N_2$ nozzle 30 are moved from the outer circumference position toward the center position of the wafer WA. Therefore, the thinner 22 and the $N_2$ gas 32 are supplied in order from the outer circumferential side of the wafer WA toward the central axis side of the wafer WA. At this time, a dropping amount of the thinner 22 dropped on the wafer WA per unit area is controlled for every radial position of the wafer WA. For example, the thinner 22 is dropped so that, the closer to the outer circumferential side of the wafer WA the position is, the more the dropping amount of the thinner 22 per unit area is. Only the amount of the thinner 22 necessary for spreading the resist 12 is dropped on the wafer WA. Therefore, a thinner film having a uniform thickness is formed on the substantially entire surface of the wafer WA.

Figure 2C:
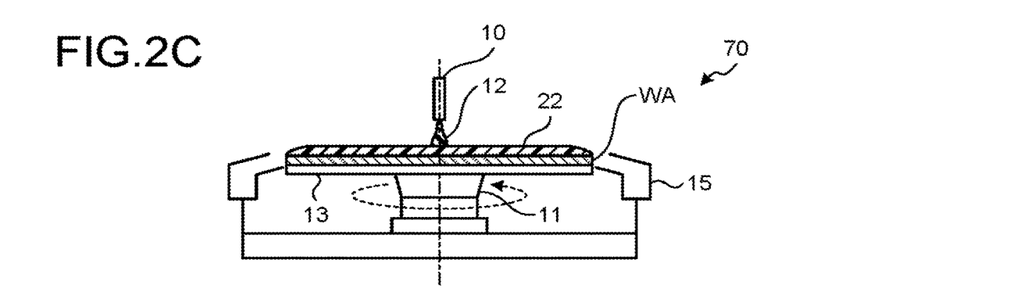

As illustrated in FIG. 2C, after the thinner 22 is dropped, the resist 12 is dropped on the wafer WA by the resist nozzle 10. The resist nozzle 10 supplies the resist 12 to the center position of the wafer WA. Therefore, the resist 12 is disposed on the entire surface of the wafer WA.

Figure 2D:
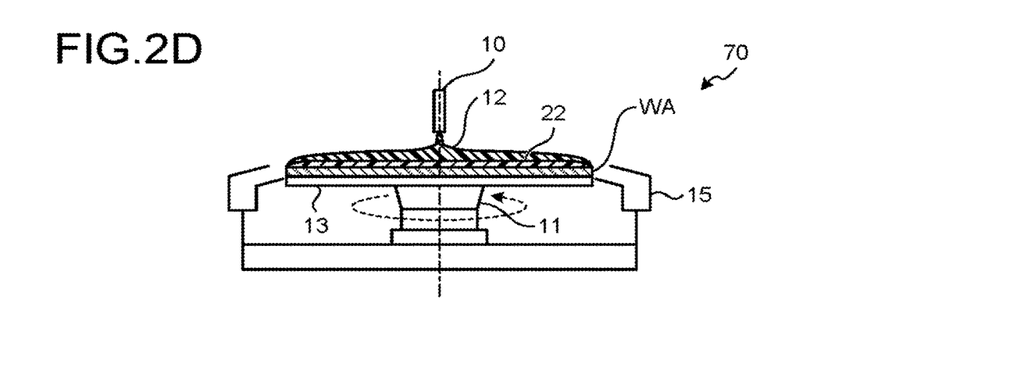

After that, the spin motor 11 rotates the wafer WA at a predetermined speed. Therefore, as illustrated in FIG. 2D, the coating apparatus 100 coats the wafer WA with the resist 12 to spread the resist and expels unnecessary resist 12 remaining on the wafer WA by a centrifugal force. After the resist 12 is disposed on the wafer WA, a drying process is performed on the top surface of the wafer WA. Therefore, a resist film having a uniform thickness is formed. In addition, in the present embodiment, since the thinner film having a uniform thickness is disposed under the resist 12, the resist film becomes homogeneous on the wafer WA. More specifically, the residual solvent in the resist film becomes homogeneous in the surface of the wafer WA. Therefore, a resist film having a predetermined uniform thickness is formed on the wafer WA.

In addition, a plurality of nozzles among the resist nozzle 10, the thinner nozzle 20, and the $N_2$ nozzle 30 may be disposed in one discharging head. In other words, two or more of the resist 12, the thinner 22, and the $N_2$ gas 32 may be discharged from one discharging head. For example, three nozzles of the resist nozzle 10, the thinner nozzle 20, and the $N_2$ nozzle 30 may be disposed in one discharging head. A configuration of the discharging head of this case will be described.

Figure 3A:
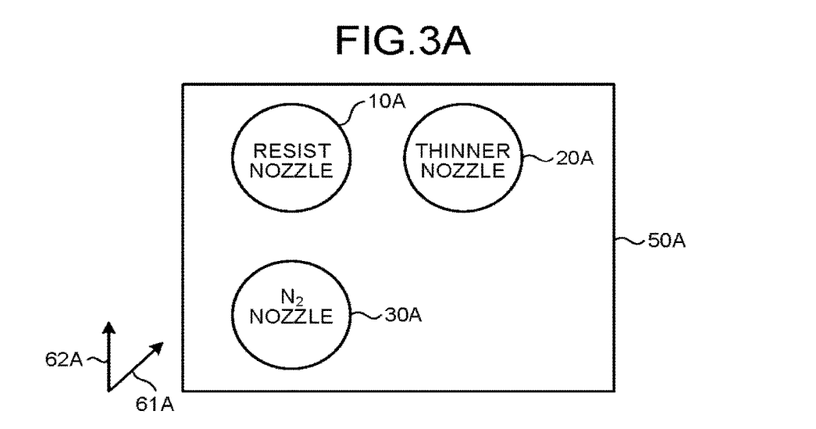
FIGS. 3A to 3C are diagrams illustrating a configuration example of a discharging head where three nozzles are disposed.
Figure 3B:
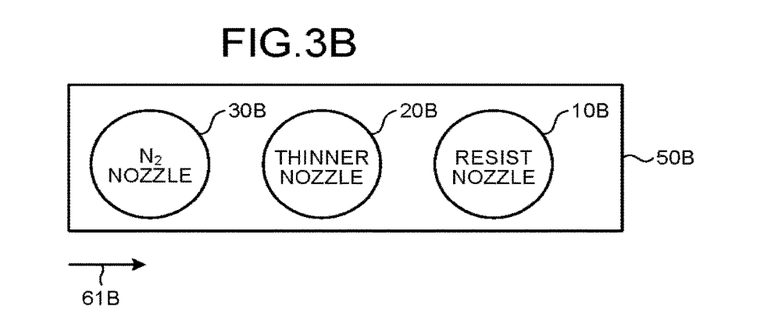
Figure 3C:
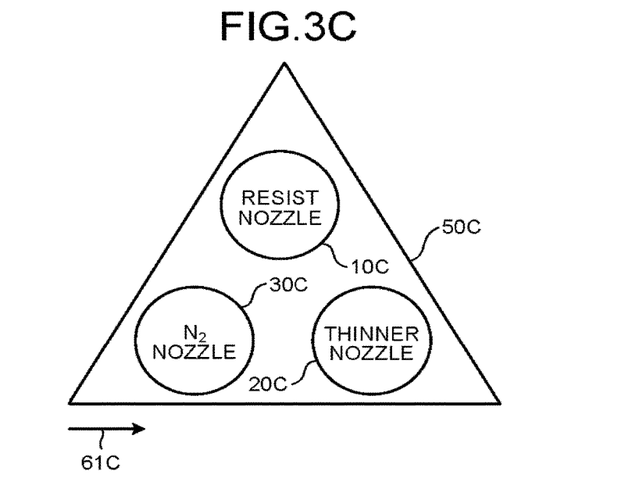

FIGS. 3A to 3C are diagrams illustrating configuration examples of the discharging heads where three nozzles are disposed. FIGS. 3A to 3C illustrate bottom diagrams (top diagrams) of discharging heads 50A to 50C, respectively. As illustrated in FIG. 3A, a resist nozzle 10A, a thinner nozzle 20A, and an $N_2$ nozzle 30A are disposed in the discharging head 50A. The resist nozzle 10A, the thinner nozzle 20A, and the $N_2$ nozzle 30A are the same as the resist nozzle 10, the thinner nozzle 20, and the $N_2$ nozzle 30, respectively.

In the discharging head 50A, the resist nozzle 10A, the thinner nozzle 20A, and the $N_2$ nozzle 30A are disposed at vertices of a right-angled isosceles triangle respectively. More specifically, the resist nozzle 10A is disposed at the apex angle of the right-angled isosceles triangle. The nozzles are arranged so that the distance between the resist nozzle 10A and the thinner nozzle 20A is equal to the distance between the resist nozzle 10A and the $N_2$ nozzle 30A. In addition, the line connecting the resist nozzle 10A and the thinner nozzle 20A is perpendicular to the line connecting the resist nozzle 10A and the $N_2$ nozzle 30A.

When the thinner 22 is to be discharged, the discharging head 50A is moved from the outer circumferential side of the wafer WA toward the center. At this time, if the $N_2$ gas 32 is discharged to the outer side of the wafer WA than the thinner 22, the discharging head 50A may be moved by setting any position as the starting position.

When the thinner 22 is to be discharged, for example, the discharging head 50A may be moved toward the direction 61A or may be moved toward the direction 62A. The direction 61A is the line direction of the line connecting the thinner nozzle 20A and the $N_2$ nozzle 30A. In this case, the direction from the outer circumferential side of the wafer WA toward the center is the direction 61A. The direction 62A is the line direction of the line connecting the resist nozzle 10A and the $N_2$ nozzle 30A. In this case, the direction from the outer circumferential side of the wafer WA toward the center is the direction 62A.

In addition, when the resist 12 is to be discharged, the discharging head 50A is moved from the center of the wafer WA toward the outer circumferential side. At this time, the discharging head 50A may be moved by setting any position as the starting position.

In addition, the thinner nozzle 20A is not limited to the vertical direction, but the thinner nozzle may discharge the thinner 22 in a slanted direction. For example, the thinner nozzle 20A may discharge the thinner 22 toward the moving path of the $N_2$ nozzle 30A.

In addition, the nozzles in the discharging head 50A are not limited to the above-described arrangement, but other arrangements may be employed. For example, the resist nozzle 10A may be disposed at the position of the thinner nozzle 20A, and the thinner nozzle 20A may be disposed at the position of the resist nozzle 10A.

As illustrated in FIG. 3B, a resist nozzle 10B, a thinner nozzle 20B, and an $N_2$ nozzle 30B are disposed in the discharging head 50B. The resist nozzle 10B, the thinner nozzle 20B, and the $N_2$ nozzle 30B are the same as the resist nozzle 10, the thinner nozzle 20, and the $N_2$ nozzle 30, respectively.

In the discharging head 50B, the resist nozzle 10B, the thinner nozzle 20B, and the $N_2$ nozzle 30B are disposed on a straight line. More specifically, in the discharging head 50B, the thinner nozzle 20B and the $N_2$ nozzle 30B are disposed to be adjacent to each other. For example, the nozzles are disposed in order of the resist nozzle 10B, the thinner nozzle 20B, and the $N_2$ nozzle 30B.

When the thinner 22 is to be discharged, the discharging head 50B is moved from the outer circumferential side of the wafer WA toward the center. At this time, if the $N_2$ gas 32 is discharged to the outer side of the wafer WA than the thinner 22, discharging head 50B may be moved by setting any position as the starting position.

When the thinner 22 is to be discharged, for example, the discharging head 50B is moved toward the direction 61B. The direction 61B is the line direction of the line connecting the resist nozzle 10B and the $N_2$ nozzle 30B. In this case, the direction from the outer circumferential side of the wafer WA toward the center is the direction 61B. In this case, for example, when the thinner 22 is to be discharged, the discharging head 50B is moved by setting the resist nozzle 10B as the starting position.

In addition, when the resist 12 is to be discharged, the discharging head 50B is moved from the center of the wafer WA toward the outer circumferential side. At this time, the discharging head 50B may be moved by setting any position as the starting position.

In addition, the thinner nozzle 20B is not limited to the vertical direction, but the thinner nozzle may discharge the thinner 22 in a slanted direction. For example, the thinner nozzle 20B may discharge the thinner 22 toward the moving path of the $N_2$ nozzle 30B.

As illustrated in FIG. 3C, the resist nozzle 10C, the thinner nozzle 20C, and the $N_2$ nozzle 30C are disposed in the discharging head 50C. The resist nozzle 10C, the thinner nozzle 20C, and the $N_2$ nozzle 30C are the same as the resist nozzle 10, the thinner nozzle 20, and the $N_2$ nozzle 30, respectively. In the discharging head 50C, the resist nozzle 10C, the thinner nozzle 20C, and the $N_2$ nozzle 30C are disposed at vertices of an equilateral triangle.

When the thinner 22 is to be discharged, the discharging head 50C is moved from the outer circumferential side of the wafer WA toward the center. At this time, if the $N_2$ gas 32 is discharged to the outer side of the wafer WA than the thinner 22, the discharging head 50C may be moved by setting any position as the starting position.

When the thinner 22 is to be discharged, for example, the discharging head 50C is moved toward the direction 61C. The direction 61C is the line direction of the line connecting the thinner nozzle 20C and the $N_2$ nozzle 30C. In this case, the direction from the outer circumferential side of the wafer WA toward the center is the direction 61C.

In addition, when the resist 12 is to be discharged, the discharging head 50C is moved from the center of the wafer WA toward the outer circumferential side. At this time, the discharging head 50C may be moved by setting any position as the starting position.

In addition, the thinner nozzle 20C is not limited to the vertical direction, but the thinner nozzle may discharge the thinner 22 in a slanted direction. For example, the thinner nozzle 20C may discharge the thinner 22 toward the moving path of the $N_2$ nozzle 30C.

In addition, when the thinner 22 is to be discharged and when the resist 12 is to be discharged, the starting positions of the discharging heads 50A to 50C may be changed. In this case, the discharging heads 50A to 50C are rotated in a plane parallel to the top surface of the wafer WA.

In addition, two nozzles among the resist nozzle 10, the thinner nozzle 20, and the $N_2$ nozzle 30 may be disposed in one discharging head. For example, two nozzles of the thinner nozzle 20 and the $N_2$ nozzle 30 are disposed in one discharging head.

Figure 4:
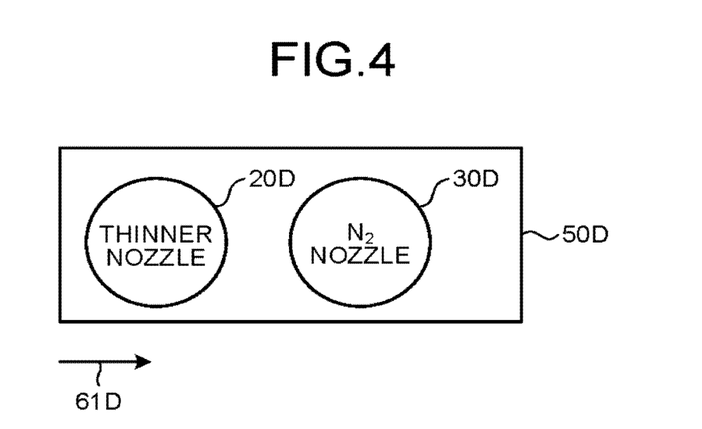
FIG. 4 is a diagram illustrating a configuration example of a discharging head where two nozzles are disposed.

FIG. 4 is a diagram illustrating a configuration example of a discharging head where two nozzles are disposed. FIG. 4 illustrates a bottom diagram (top diagram) of a discharging head 50D. A thinner nozzle 20D and an $N_2$ nozzle 30D are disposed in the discharging head 50D. The resist nozzle 10D, the thinner nozzle 20D, and the $N_2$ nozzle 30D are the same as the resist nozzle 10, the thinner nozzle 20, and the $N_2$ nozzle 30, respectively.

When the thinner 22 is to be discharged, the discharging head 50D is moved from the outer circumferential side of the wafer WA toward the center. At this time, if the $N_2$ gas 32 is discharged to the outer side of the wafer WA than the thinner 22, the discharging head 50D may be moved by setting any position as the starting position.

When the thinner 22 is to be discharged, for example, the discharging head 50D is moved toward the direction 61D. The direction 61D is the line direction of the line connecting the resist nozzle 10D and the $N_2$ nozzle 30D. In this case, the direction from the outer circumferential side of the wafer WA toward the center is the direction 61D.

In addition, the thinner nozzle 20D is not limited to the vertical direction, but the thinner nozzle may discharge the thinner 22 in a slanted direction. For example, the thinner nozzle 20D may discharge the thinner 22 toward the moving path of the $N_2$ nozzle 30D.

Herein, a case where the thinner nozzles 20A to 20D discharge the thinner 22 in a slanted direction will be described. Since the thinner nozzles 20A to 20D perform the same discharging, herein, the thinner nozzle 20A illustrated in FIG. 3A is described.

Figure 5A:
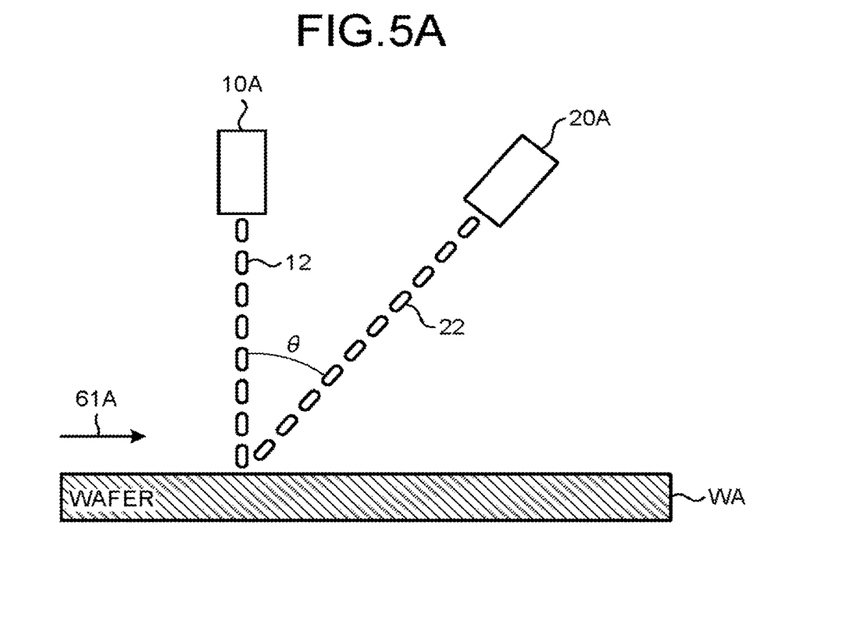
FIGS. 5A and 5B are diagrams for describing discharging in a slanted direction by a thinner nozzle.
Figure 5B:
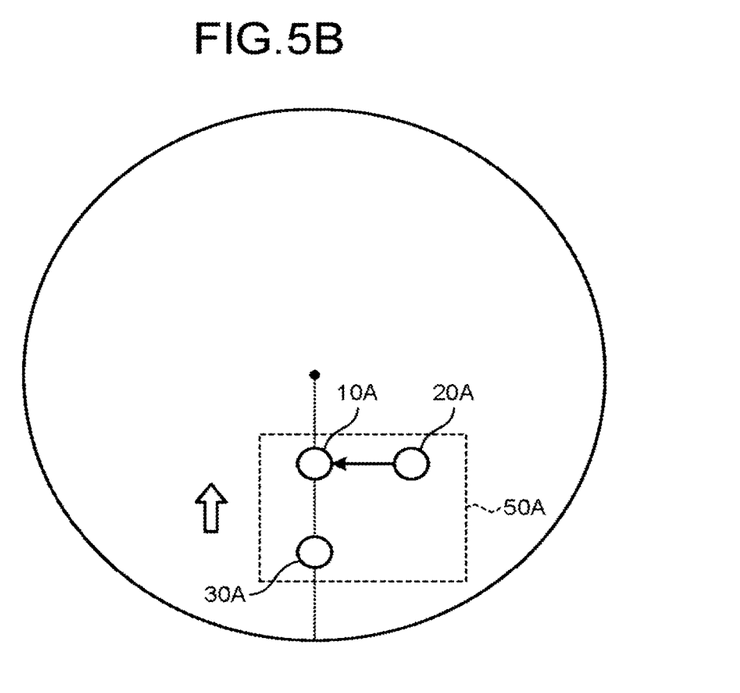

FIGS. 5A and 5B are diagrams for describing discharging in a slanted direction by a thinner nozzle. FIG. 5A schematically illustrates arrangement positions of the nozzles as the discharging head 50A is viewed in the horizontal direction. In addition, FIG. 5B schematically illustrates arrangement positions of the nozzles as the wafer WA and the discharging head 50A are viewed from the top surface side.

The discharging direction by the thinner nozzle 20A and discharging direction by the resist nozzle 10A have a predetermined angle θ. The discharging direction by the resist nozzle 10A has an angle of 90 degrees (vertical direction) with respect to the wafer WA. In addition, the discharging direction by the thinner nozzle 20A has a predetermined angle θ (for example, 45 degrees) with respect to the wafer WA. In this case, the discharging direction by the thinner nozzle 20A and the discharging direction by the resist nozzle 10A have an angle of 45 degrees.

In this manner, in the discharging head 50A, the thinner nozzle 20 discharges the thinner 22 in a slanted direction so that the dropping position of the resist 12 by the resist nozzle 10A is the same as the dropping position of the thinner 22 by the thinner nozzle 20A.

Due to such a configuration, when the thinner 22 is to be discharged and when the resist 12 is to be discharged, there is no need to perform adjusting the position of the discharging head 50A. In other words, after the discharging of the thinner 22 by the thinner nozzle 20A is completed, the discharging of the resist 12 by the resist nozzle 10 can be started without moving the discharging head 50A. Therefore, when the thinner 22 is to be discharged and when the resist 12 is to be discharged, the discharging head 50A can reciprocate the same straight line.

Figure 6:
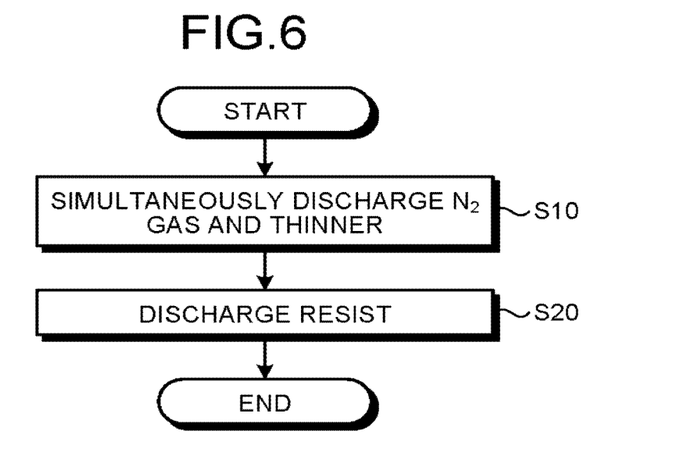
FIG. 6 is a flowchart illustrating a procedure of the coating processing of the coating apparatus according to the embodiment.

FIG. 6 is a flowchart illustrating a procedure of a coating process of the coating apparatus according to the embodiment. The wafer WA is placed on the support base 13. After that, the spin motor 11 rotates the support base 13 at a predetermined rotation speed to rotate the wafer WA. The coating apparatus 100 discharges the thinner 22 on the wafer WA by the thinner nozzle 20 and discharges the $N_2$ gas 32 on the wafer WA by the $N_2$ nozzle 30. Therefore, the $N_2$ gas 32 and the thinner 22 are simultaneously discharged (step S10). At this time, the $N_2$ nozzle 30 sprays the $N_2$ gas 32 in the side of the wafer WA outer than the thinner 22. In other words, the thinner nozzle 20 sprays the thinner 22 in the side of the wafer WA inner than the $N_2$ gas 32.

The thinner nozzle 20 and the $N_2$ nozzle 30 are moved from the outer circumference position toward the center position of the wafer WA. The controller 80 controls a dropping amount of the thinner 22 dropped on the wafer WA per unit area for every radial position of the wafer WA. For example, the controller 80 controls the flowrate of the thinner 22 for every radial position of the wafer WA. In addition, the controller 80 may control the moving speeds of the thinner nozzle 20 and the $N_2$ nozzle 30 for every radial position of the wafer WA.

The thinner nozzle 20 and the $N_2$ nozzle 30 continue to perform the process of discharging the thinner 22 and the $N_2$ gas 32 from the outer circumference position of the wafer WA to the center position, so that the thinner 22 and the $N_2$ gas 32 are discharged on the entire surface of the wafer WA. Therefore, the entire surface of the wafer WA is coated with the thinner 22.

If the thinner 22 is dropped to the center position of the wafer WA, the resist nozzle 10 discharges the resist 12 on the wafer WA (step S20). The resist nozzle 10 is moved from the center position of the wafer WA toward the outer circumference position. In this case, the controller 80 may control a dropping amount of the resist 12 dropped on the wafer WA per unit area for every radial position of the wafer WA. For example, the controller 80 controls the flowrate of the resist 12 for every radial position of the wafer WA. In addition, the controller 80 may control the moving speed of the resist nozzle 10 for every radial position of the wafer WA. For example, the controller 80 controls the resist nozzle 10 so that, the closer to the outer circumferential portion of the wafer WA the position is, the more the resist 12 is dropped.

The resist nozzle 10 continues to perform the process of discharging the resist 12 from the center position of the wafer WA to the outer circumference position, so that the resist 12 is discharged on the entire surface of the wafer WA. Therefore, the entire surface of the wafer WA is coated with the resist 12.

The thinner 22 on the wafer WA is dissolved into the resist 12. Since the thinner 22 of the present embodiment is dropped on the wafer WA while the $N_2$ gas 32 is sprayed, the thickness thereof on the wafer WA becomes uniform. In addition, since the thinner 22 having a uniform thickness is coated with the resist 12 of the present embodiment, the solvent of the thinner 22 is uniformly dissolved into the resist 12.

After the wafer WA is coated with the resist 12, a drying process is performed on the top surface of the wafer WA. Therefore, a resist film is formed on the wafer WA. In the present embodiment, since the solvent of the thinner 22 is uniformly dissolved into the resist 12, the resist film having homogeneous film properties is formed on the wafer WA.

In the resist film, the residual thinner amount is uniform in the surface of the wafer WA. Therefore, in a case where an exposing process and a developing process are performed on the resist film, a pattern having stabilized pattern dimensions in the surface of the wafer WA can be formed. In other words, after the exposing process of forming a latent image of a wafer pattern and the developing process of forming a resist pattern are performed, the dimensions and shape of the resist pattern are stabilized in the radial direction of the wafer WA.

In addition, since the amount of solvent in the resist film can be supplied uniformly over the entire surface of the wafer WA, the properties of the resist film can be controlled, and the consumed amount of the resist 12 can be reduced. In addition, since the dimensions and shape of the resist pattern are stabilized in the radial direction of the wafer WA, reliability of the semiconductor element can be improved, and the yield of the semiconductor device can be improved.

The coating process by the coating apparatus 100 is performed, for example, for every layer in the wafer process. Next, the resist pattern is formed by using the coated resist film, and thus, the semiconductor device (semiconductor integrated circuit) is manufactured.

More specifically, a to-be-processed film is disposed on the wafer WA, and the to-be-processed film is coated with the resist film by using the coating apparatus 100 or the like. Next, the exposing process is performed on the wafer WA coated with the resist film. At this time, a semiconductor element pattern formed in a reticle (photomask) is transferred to the resist film, and thus, a latent image is formed. After, the wafer WA is developed, so that the resist pattern is formed on the wafer WA. At this time, a developing solution is supplied onto the wafer WA where the latent image is formed, so that the resist pattern is formed.

Next, the to-processed film disposed to the lower layer side of the resist pattern is etched by using the resist pattern as a mask. Therefore, an actual pattern according to the resist pattern is formed on the wafer WA. When the semiconductor device is to be manufactured, the arranging process, the coating process, the exposing process, the developing process, the etching process, and the like of the to-be-processed film described above are repeated for every layer.

In addition, the coating process according to the present embodiment is not limited to a case where the embodiment is applied to a lithography process, but the coating process may be applied to other processes. For example, the coating apparatus 100 is not limited to the resist coating, but the coating apparatus may be applied to SOG (Spin On Glass) coating or SOC (Spun On Carbon) coating.

In addition, the $N_2$ gas 32 and the thinner 22 are not limited to the case of being simultaneously discharged, but the $N_2$ gas and the thinner may be discharged at different timings. In addition, the thinner 22 is not limited to a case where the dropping amount of the thinner 22 dropped on the wafer WA per unit area is controlled for every radial position of the wafer WA. For example, the dropping amount of the thinner 22 per unit area may be equal at all the radial positions of the wafer WA.

In this manner, according to the embodiment, the coating apparatus 100 includes the thinner nozzle 20, the resist nozzle 10, and the $N_2$ nozzle 30. In addition, the resist nozzle 10 discharges the resist 12 on the top surface of the wafer WA. In addition, the thinner nozzle 20 discharges the thinner 22 of which surface tension is higher than that of the resist 12 on the top surface of the wafer WA. In addition, the $N_2$ nozzle 30 is disposed in the side outer than the thinner nozzle 20 in the wafer WA and discharges the $N_2$ gas on the top surface of the wafer WA. Therefore, the wafer WA can be coated with the resist film having uniform film properties.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A coating method comprising:
    ejecting a first liquid on a top surface of a rotating substrate;
    ejecting a second liquid on the top surface of the rotating substrate, surface tension of the second liquid being higher than surface tension of the first liquid;
    ejecting a gas on the top surface of the rotating substrate at a position radially further away from a center of the rotating substrate than another position on the rotating substrate where the second liquid has been ejected; and
    ejecting the second liquid while moving from an outer circumferential side of the rotating substrate toward the center of the rotating substrate,
    wherein ejecting the first liquid occurs after both ejecting the second liquid and ejecting the gas have been completed.

2. The coating method according to claim 1, further comprising:
    ejecting an amount of the second liquid corresponding to a radial position of the substrate.

3. The coating method according to claim 1, further comprising:
    moving a nozzle that ejects the second liquid at a speed corresponding to a radial position of the substrate.

4. The coating method according to claim 1, further comprising:
    ejecting the gas and the second liquid simultaneously.

5. The coating method according to claim 1, further comprising:
    ending the ejection of the second liquid when the second liquid has been ejected on the center of the substrate.

6. The coating method according to claim 1, further comprising:
    ejecting the second liquid so that, the closer to an outer circumferential side of the substrate, the more the second liquid is ejected.

7. The coating method according to claim 1, wherein
    the first liquid is a resist, and
    the second liquid is a thinner.

* * * * *